United States Patent
Kinoshita et al.

(10) Patent No.: US 9,054,168 B2
(45) Date of Patent: Jun. 9, 2015

(54) FIELD-EFFECT TRANSISTOR

(71) Applicant: Mitsubishi Electric Corporation, Tokyo (JP)

(72) Inventors: Yoichi Kinoshita, Tokyo (JP); Hajime Sasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/217,633

(22) Filed: Mar. 18, 2014

(65) Prior Publication Data
US 2014/0319582 A1    Oct. 30, 2014

(30) Foreign Application Priority Data
Apr. 25, 2013 (JP) .................................. 2013-092624

(51) Int. Cl.
| H01L 29/66 | (2006.01) |
| H01L 29/778 | (2006.01) |
| H01L 29/06 | (2006.01) |
| H01L 29/20 | (2006.01) |

(52) U.S. Cl.
CPC .......... *H01L 29/778* (2013.01); *H01L 29/7787* (2013.01); *H01L 29/0607* (2013.01); *H01L 29/0642* (2013.01); *H01L 29/2003* (2013.01)

(58) Field of Classification Search
CPC ............ H01L 29/0607; H01L 29/0642; H01L 29/2003; H01L 29/778; H01L 29/7787
USPC ...................... 257/194, 136, 76, 77, E29.246, 257/E29.247, E29.248, E29.252, E21.403, 257/E21.407; 438/167, 172, 142, 183, 290, 438/478, 179

See application file for complete search history.

(56) References Cited

U.S. PATENT DOCUMENTS

| 5,448,086 A | * | 9/1995 | Hida ............................. 257/194 |
| 5,918,130 A | * | 6/1999 | Hause et al. .................. 438/290 |
| 7,648,867 B2 | * | 1/2010 | Watanabe et al. ............. 438/183 |
| 8,114,717 B2 | * | 2/2012 | Palacios et al. ............... 438/142 |
| 8,728,884 B1 | * | 5/2014 | Hussain et al. ............... 438/172 |
| 2005/0212049 A1 | * | 9/2005 | Onodera ........................ 257/355 |
| 2006/0281284 A1 | * | 12/2006 | Harris et al. ................... 438/478 |
| 2007/0114569 A1 | * | 5/2007 | Wu et al. ........................ 257/194 |
| 2008/0067548 A1 | * | 3/2008 | Herman ......................... 257/201 |
| 2009/0032820 A1 | * | 2/2009 | Chen .............................. 257/76 |
| 2009/0039392 A1 | | 2/2009 | Herman |

(Continued)

FOREIGN PATENT DOCUMENTS

| JP | 11-145157 A | 5/1999 |
| JP | 2009-530857 A | 9/2007 |

(Continued)

*Primary Examiner* — Mohammed Shamsuzzaman
(74) *Attorney, Agent, or Firm* — Leydig, Voit & Mayer, Ltd.

(57) ABSTRACT

A field-effect transistor includes a channel layer in which a two-dimensional electron gas is formed, an electron supply layer located on the channel layer, a source electrode located on the electron supply layer, a drain electrode located on the electron supply layer, a gate electrode located on the electron supply layer between the source electrode and the drain electrode, and an embedded layer embedded in the channel layer deeper than a two-dimensional electron gas region where the two-dimensional electron gas is formed, directly opposite an edge of the gate electrode on a side of the gate electrode toward the drain electrode. The embedded layer is a material that increases potential of the two-dimensional electron gas region.

3 Claims, 6 Drawing Sheets

(56) References Cited

U.S. PATENT DOCUMENTS

| | | | |
|---|---|---|---|
| 2009/0072269 A1* | 3/2009 | Suh et al. | 257/136 |
| 2010/0025730 A1* | 2/2010 | Heikman et al. | 257/194 |
| 2010/0127275 A1* | 5/2010 | Takehiko et al. | 257/76 |
| 2010/0327322 A1* | 12/2010 | Kub et al. | 257/194 |
| 2011/0272708 A1* | 11/2011 | Yoshioka et al. | 257/77 |
| 2011/0272741 A1* | 11/2011 | Hwang | 257/194 |
| 2013/0111977 A1* | 5/2013 | Offermans et al. | 73/31.06 |
| 2013/0153963 A1* | 6/2013 | Shealy et al. | 257/190 |
| 2013/0168737 A1* | 7/2013 | Prechtl et al. | 257/194 |
| 2014/0252370 A1* | 9/2014 | Kwak et al. | 257/76 |
| 2014/0264379 A1* | 9/2014 | Kub et al. | 257/77 |
| 2014/0319532 A1* | 10/2014 | Werner | 257/76 |
| 2014/0361309 A1* | 12/2014 | Mishra et al. | 257/76 |

FOREIGN PATENT DOCUMENTS

| | | |
|---|---|---|
| JP | 2008-306083 A | 12/2008 |
| JP | 2010-251370 A | 11/2010 |

\* cited by examiner

FIELD-EFFECT TRANSISTOR

BACKGROUND OF THE INVENTION

1. Field of the Invention

The present invention relates to a field-effect transistor that operates, for example, in a high frequency band.

2. Background Art

National Publication of International Patent Application No. 2009-530857 discloses a field-effect transistor that reduces a peak electric field at a gate edge and corner by reducing a concentration of movable charge in a 2DEG (two-dimensional electron gas). More specifically, a charge reduction region is formed in a region where the two-dimensional electron gas of a channel layer is formed. In a current-carrying state, the charge reduction region has lower conductivity than adjacent regions.

Field-effect transistors to which high voltage is applied have a problem that an electric field is concentrated directly below an end of a gate electrode on a drain electrode side, producing crystal defects. Crystal defects may cause characteristics of the field-effect transistors to deteriorate. It is therefore necessary to reduce the electric field directly below the end of the gate electrode on the drain electrode side.

As the technique disclosed in National Publication of International Patent Application No. 2009-530857, the electric field can be reduced by providing the charge reduction region in the region in which the two-dimensional electron gas is formed. However, providing the charge reduction region in the region in which the two-dimensional electron gas is formed causes the concentration of the two-dimensional electron gas to drastically decrease, resulting in a problem of deteriorating electric characteristics of the field-effect transistor.

SUMMARY OF THE INVENTION

The present invention has been implemented to solve the problems described above and it is an object of the present invention to provide a field-effect transistor capable of preventing deterioration of electric characteristics while preventing an electric field from concentrating directly below an end of a gate electrode on a drain electrode side, producing crystal defects. The features and advantages of the present invention may be summarized as follows.

According to one aspect of the present invention, a field-effect transistor includes a channel layer in which a two-dimensional electron gas is formed, an electron supply layer formed on the channel layer, a source electrode formed on the electron supply layer, a drain electrode formed on the electron supply layer, a gate electrode formed at a position on the electron supply layer interposed between the source electrode and the drain electrode, and an embedded layer embedded in a place deeper than a two-dimensional electron gas region where the two-dimensional electron gas is formed in the channel layer directly below an end of the gate electrode on the drain electrode side. The embedded layer is made of a material that increases a potential of the two-dimensional electron gas region compared to a case without the embedded layer.

According to another aspect of the present invention, a field-effect transistor includes a channel layer in which a two-dimensional electron gas is formed, an electron supply layer formed on the channel layer, a source electrode formed on the electron supply layer, a drain electrode formed on the electron supply layer, and a gate electrode formed on the electron supply layer between the source electrode and the drain electrode, an undersurface of which is formed of a curved surface.

Other and further objects, features and advantages of the invention will appear more fully from the following description.

DETAILED DESCRIPTION OF THE PREFERRED EMBODIMENTS

A field-effect transistor according to embodiments of the present invention will be described with reference to the accompanying drawings. The same or corresponding components will be assigned the same reference numerals and duplicate description may be omitted.

First Embodiment

Figure 1:
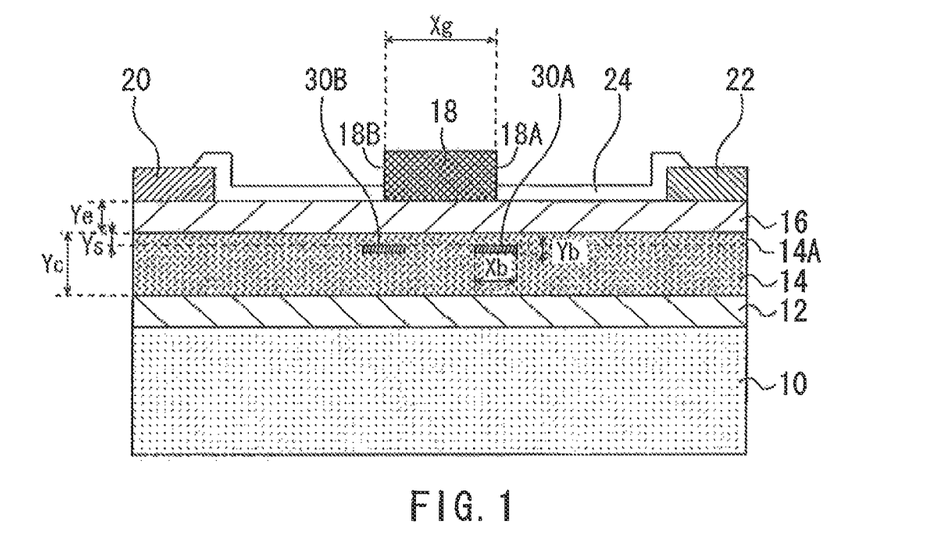
FIG. 1 is a cross-sectional view of a field-effect transistor according to the first embodiment.

FIG. 1 is a cross-sectional view of a field-effect transistor according to a first embodiment of the present invention. This field-effect transistor is provided with a substrate 10 made of, for example, SiC or Si. A channel layer 14 is formed above the substrate 10 via a lattice relaxation layer 12. The lattice relaxation layer 12 is made of AlN to reduce a lattice mismatch between the substrate 10 and the channel layer 14. The channel layer 14 is made of GaN. A layer thickness Yc of the channel layer 14 is, for example, 1 µm. A two-dimensional electron gas (2DEG) is formed in the channel layer 14.

An electron supply layer 16 is formed on the channel layer 14. The electron supply layer 16 is made of AlGaN. The electron supply layer 16 has a layer thickness Ye of, for example, 20 to 30 nm. The electron supply layer 16 is a layer that forms a Schottky barrier and also supplies electrons to the channel layer 14. Note that the lattice relaxation layer 12, the channel layer 14 and the electron supply layer 16 are each formed of an epilayer. Moreover, the conductive type of the channel layer 14 and the electron supply layer 16 is n-type.

A gate electrode 18, a source electrode 20 and a drain electrode 22 are formed on the electron supply layer 16. The gate electrode 18 is interposed between the source electrode 20 and the drain electrode 22. The gate electrode 18A has a width Xg of, for example, 0.2 to 0.7 µm. A protective film 24 is formed so as to cover the electron supply layer 16, whereas it has the gate electrode 18, the source electrode 20 and the drain electrode 22 exposed to the outside. The protective film 24 is made of, for example, SiN or SiO. The protective film 24 has a thickness of, for example, 100 nm to several hundred nm.

An embedded layer 30A and an additional embedded layer 30B are embedded in the channel layer 14. The embedded layer 30A and the additional embedded layer 30B are made of AlGaN. The embedded layer 30A is embedded in the channel layer 14 directly below an end 18A of the gate electrode 18 on the drain electrode 22 side. Moreover, the embedded layer 30A is embedded in a place deeper than a two-dimensional electron gas region 14A in which the two-dimensional electron gas is formed. The two-dimensional electron gas region 14A is a region that extends from the surface of the channel layer 14 to a depth Ys. The depth Ys is, for example, 1 to 20 nm. The embedded layer 30A has a width Xb of, for example, 0.1 to 2 μm and a height Yb of, for example, 10 nm to 0.5 μm.

The additional embedded layer 30B is embedded in the channel layer 14 directly below an end 18B of the gate electrode 18 on the source electrode 20 side. Moreover, the additional embedded layer 30B is embedded in a place deeper than the two-dimensional electron gas region 14A. The additional embedded layer 30B has the same size as the embedded layer 30A.

Figure 2:
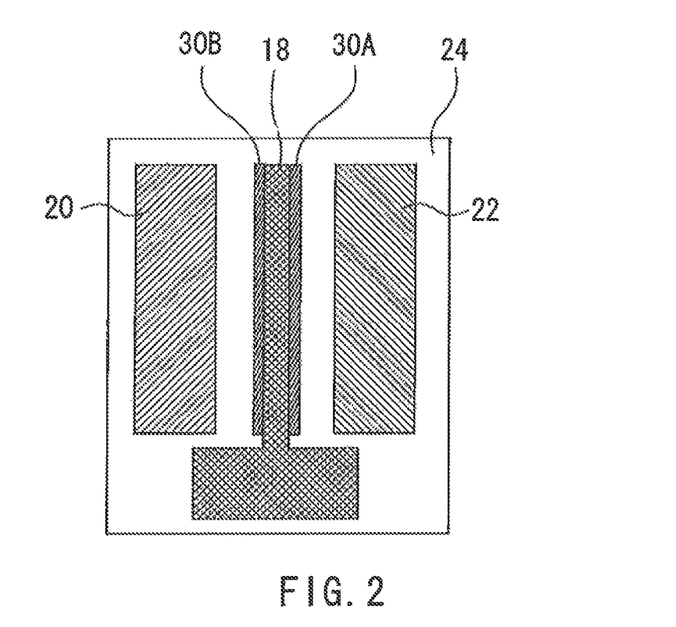
FIG. 2 is a plan view of the field-effect transistor of FIG. 1.

FIG. 2 is a plan view of the field-effect transistor of FIG. 1. FIG. 2 illustrates the embedded layer 30A and the additional embedded layer 30B for convenience of description. The gate electrode 18 is formed into a linear shape in a plan view. The embedded layer 30A and the additional embedded layer 30B are formed into a linear shape in a plan view so as to extend along a longitudinal direction of the gate electrode 18.

Figure 3:
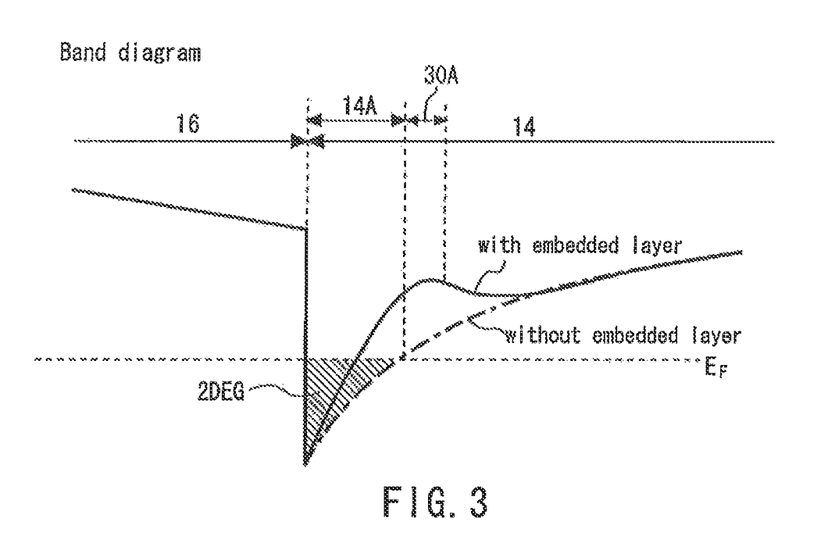
FIG. 3 is a band diagram of the electron supply layer and the channel layer.

FIG. 3 is a band diagram of the electron supply layer and the channel layer. A solid line illustrates a band structure of the field-effect transistor according to the first embodiment of the present invention and a single-dot dashed line illustrates a band structure without any embedded layer. The potential of the two-dimensional electron gas region 14A increases when the embedded layer 30A is formed compared to the case without any embedded layer. Thus, forming the embedded layer 30A makes it possible to reduce an electron gas concentration in the two-dimensional electron gas region 14A.

Thus, the embedded layer 30A causes the two-dimensional electron gas concentration directly below the end of the gate electrode 18 on the drain electrode 22 side to decrease, and can thereby reduce the electric field of this portion. Likewise, the additional embedded layer 30B causes a two-dimensional electron gas concentration directly below the end of the gate electrode 18 on the source electrode 20 side to decrease, and can thereby reduces the electric field of this portion. Therefore, it is possible to solve the problem that the electric field is concentrated directly below the end of the gate electrode 18 on the drain electrode 22 side and directly below the end on the source electrode 20 side, producing crystal defects, and thereby extend the life of the field-effect transistor.

However, when the embedded layer and the additional embedded layer are formed in the two-dimensional electron gas region 14A, the potential of the two-dimensional electron gas region 14A increases excessively, causing the concentration of the two-dimensional electron gas to drastically decrease. In this case, electric characteristics such as high-frequency electric characteristics of the field-effect transistor deteriorate. Thus, in the field-effect transistor according to the first embodiment of the present invention, the embedded layer 30A and the additional embedded layer 30B are embedded in a place deeper than the two-dimensional electron gas region 14A. This avoids the concentration of the two-dimensional electron gas from drastically decreasing, and can thereby prevent electric characteristics from deteriorating.

With the field-effect transistor according to the first embodiment made of a GaN-based material, for example, a voltage of 60 V is applied between the drain electrode and the source electrode, −5 V between the gate electrode and the source electrode, and 65 V between the gate electrode and the drain electrode. When a high voltage is applied between the gate electrode and the drain electrode, an electric field is likely to concentrate directly below the end of the gate electrode on the drain electrode side, and therefore forming the embedded layer 30A is effective. Thus, in the case of a field-effect transistor which applies a certain degree of high voltage between the gate electrode and the drain electrode, forming the embedded layer 30A can solve the problem of concentration of the electric field, and therefore the material of the electric field transistor is not limited to a GaN-based material.

The effect of forming an embedded layer is particularly remarkable with a field-effect transistor that applies a higher voltage than a field-effect transistor using GaAs whose band gap is 1.42 eV for its channel layer.

Figure 4:
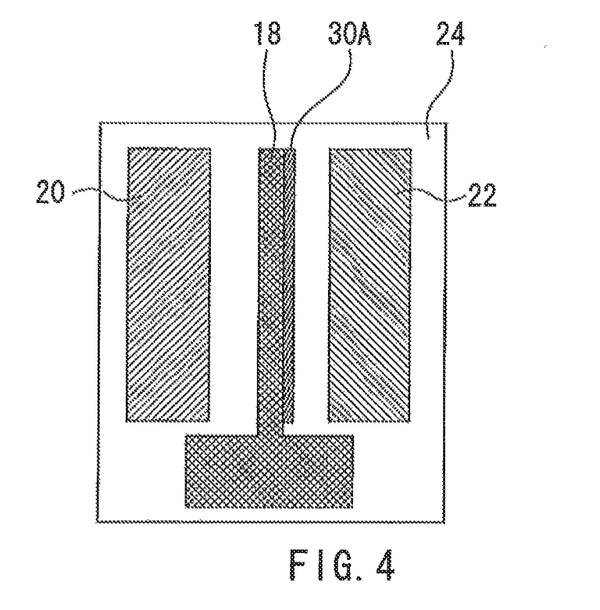
FIG. 4 is a plan view of a field-effect transistor whose additional embedded layer is omitted.

The material of the embedded layer 30A and the additional embedded layer 30B is not particularly limited as long as it increases the potential of the two-dimensional electron gas region 14A. It is directly below the end of the gate electrode 18 on the drain electrode 22 side that crystal defects attributable to concentration of an electric field are most likely to occur. Therefore, the additional embedded layer 30B may be omitted. FIG. 4 is a plan view of a field-effect transistor whose additional embedded layer is omitted.

Figure 5:
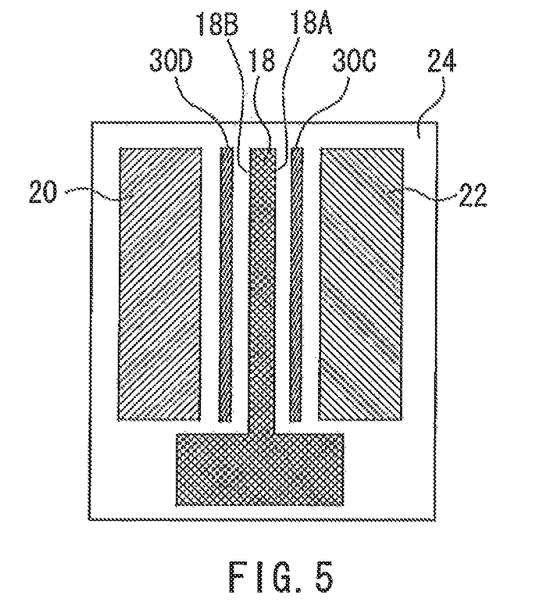
FIG. 5 is a diagram illustrating a modification example of positions at which the embedded layers are formed.

FIG. 5 is a diagram illustrating a modification example of positions at which the embedded layers are formed. An embedded layer 30C is formed closer to the drain electrode 22 side than directly below the end 18A of the gate electrode 18 on the drain electrode 22 side. An additional embedded layer 30D is formed closer to the source electrode 20 side than directly below the end 18B of the gate electrode 18 on the source electrode 20 side. When compared to the embedded layer 30A, the embedded layer 30C has a smaller effect of increasing the potential of the two-dimensional electron gas region directly below the end 18A. The same applies to the additional embedded layer 30D. Therefore, the embedded layer 30C and the embedded layer 30D are useful when an extremely small extent of electric field relaxation is desired to be realized directly below the end 18A and directly below the end 18B. Note that these modifications are also applicable to field-effect transistors according to the following embodiments.

Second Embodiment

Figure 6:
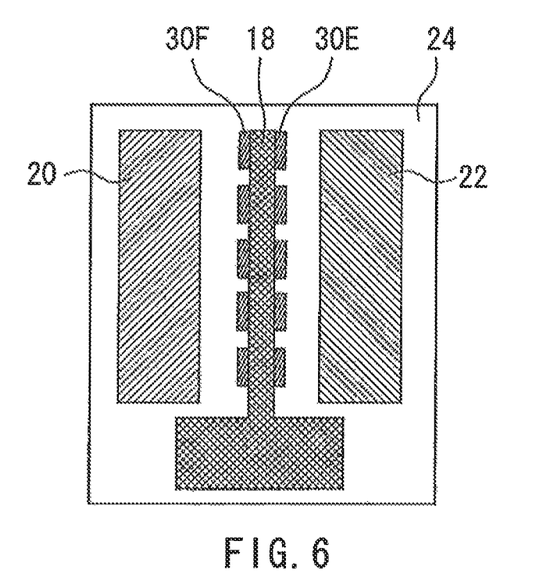
FIG. 6 is a plan view of the field-effect transistor according to the second embodiment.

Since a field-effect transistor according to a second embodiment of the present invention has many points in common with the first embodiment, differences from the first embodiment will be mainly described. FIG. 6 is a plan view of the field-effect transistor according to the second embodiment of the present invention. Embedded layers 30E are formed intermittently along the gate electrode 18 in a plan view. The same applies to additional embedded layers 30F.

According to the field-effect transistor according to the second embodiment of the present invention, by changing the sizes of the embedded layers 30E and the additional embedded layers 30F formed into an island shape, it is possible to easily adjust the potential of the two-dimensional electron gas region.

Third Embodiment

Figure 7:
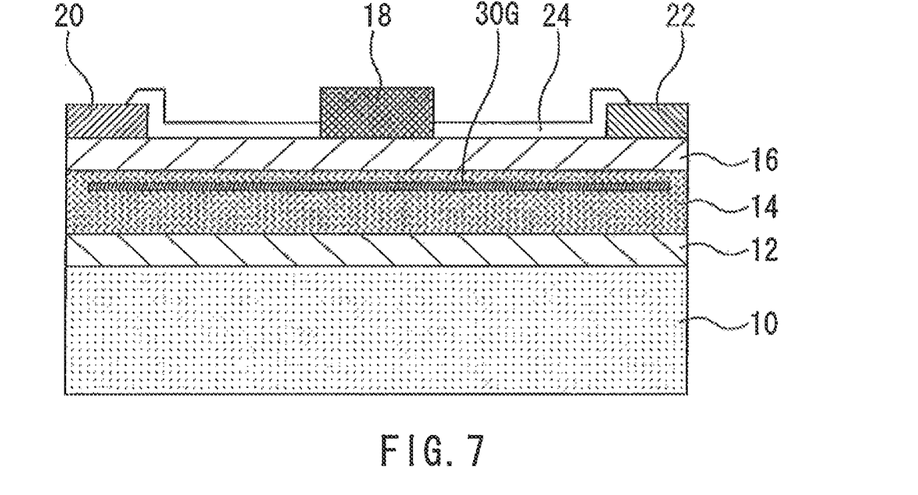
FIG. 7 is a cross-sectional view of the field-effect transistor according to the third embodiment.

Since a field-effect transistor according to a third embodiment of the present invention has many points in common with the first embodiment, differences from the first embodiment will be mainly described. FIG. 7 is a cross-sectional view of the field-effect transistor according to the third embodiment of the present invention. An embedded layer 30G is embedded over the whole surface of a so-called active region of the channel layer 14.

According to the field-effect transistor according to the third embodiment of the present invention, it is possible to increase the potential of the whole two-dimensional electron gas region.

Fourth Embodiment

Figure 8:
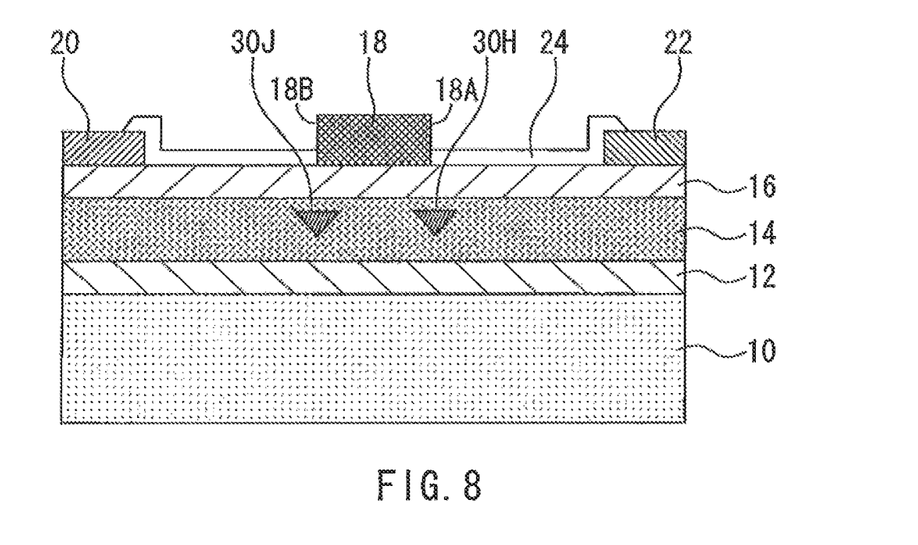
FIG. 8 is cross-sectional view of the field-effect transistor according to the fourth embodiment.

Since a field-effect transistor according to a fourth embodiment of the present invention has many points in common with the first embodiment, differences from the first embodiment will be mainly described. FIG. 8 is cross-sectional view of the field-effect transistor according to the fourth embodiment of the present invention. An embedded layer 30H and an additional embedded layer 30J are formed into a triangular shape in a cross-sectional view. The embedded layer 30H is formed such that extending directions of the respective sides of the triangle are not oriented toward the end of the gate electrode 18 on the drain electrode 22 side. The additional embedded layer 30J is formed such that extending directions of the respective sides of the triangle are not oriented toward the end of the gate electrode 18 on the source electrode 20 side.

Forming the embedded layer 30H and the additional embedded layer 30J into an inverted triangular shape makes it possible to prevent dislocation originating in these parts from extending to regions directly below the ends 18A and 18B. The dislocation is shown by a broken line in FIG. 8.

Fifth Embodiment

Figure 9:
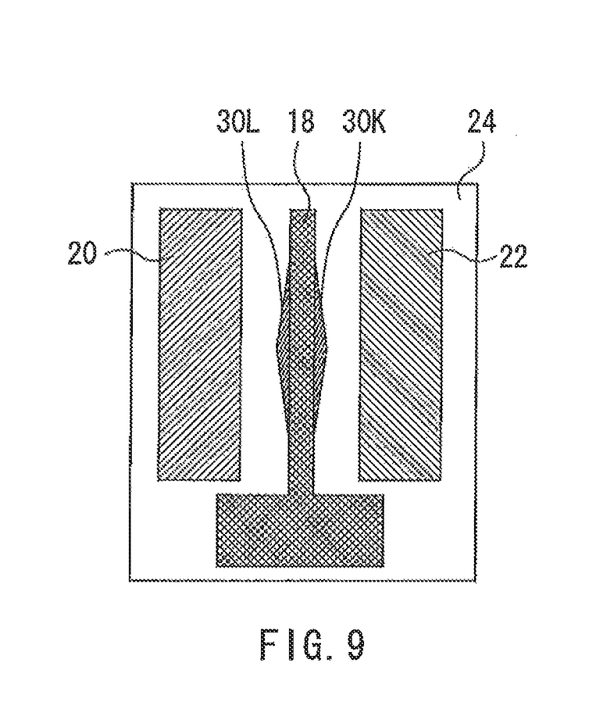
FIG. 9 is a plan view of the field-effect transistor according to the fifth embodiment.

Since a field-effect transistor according to a fifth embodiment of the present invention has many points in common with the first embodiment, differences from the first embodiment will be mainly described. FIG. 9 is a plan view of the field-effect transistor according to the fifth embodiment of the present invention. An embedded layer 30K and an additional embedded layer 30L are formed in a plan view such that each width of the layers 30K and 30L decreases from a portion contacting a center part of the gate electrode 18 toward a portion contacting an end part of the gate electrode 18. That is, the embedded layer 30K and the additional embedded layer 30L formed into a linear shape in a plan view each have the width which is the largest in the center part and decreases toward the end.

The center part of the field-effect transistor in a plan view is a region where it is difficult to dissipate heat and temperature is likely to rise. Therefore, if the concentration of the two-dimensional electron gas in the center part is assumed to be on the same level with that of the outer circumferential region, the center part is likely to deteriorate first. Thus, by forming the embedded layer 30K and the additional embedded layer 30L such that each width of the layers 30K and 30L decreases from a portion contacting a center part of the gate electrode 18 toward a portion contacting an end part of the gate electrode 18 in a plan view, the concentration of the two-dimensional electron gas in the center part is reduced. Thus, it is possible to prevent deterioration due to a temperature rise in the center part.

The shapes of the embedded layer 30K and the additional embedded layer 30L are not limited to those in FIG. 9. That is, it is preferable to adjust the widths of the embedded layer and the additional embedded layer so that a thermal distribution of the field-effect transistor is uniform within its plane.

Sixth Embodiment

Figure 10:
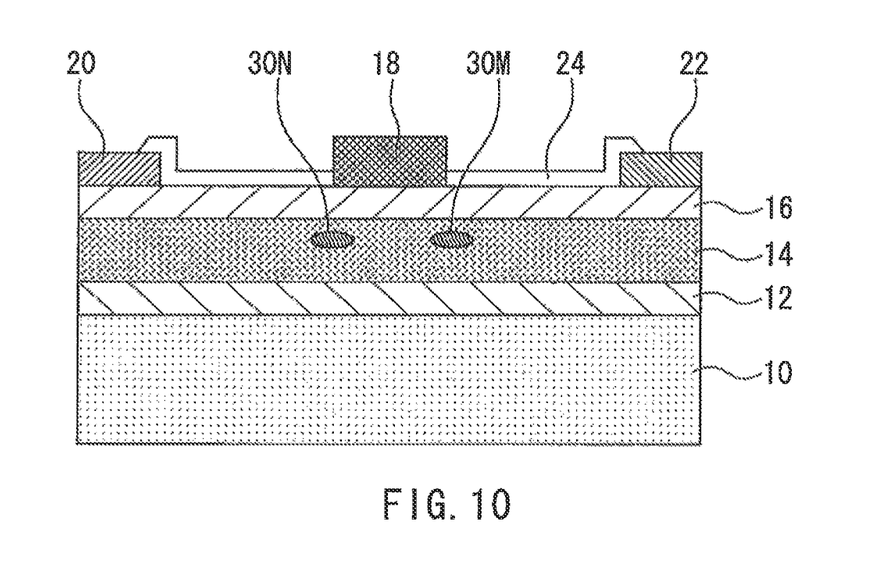
FIG. 10 is a cross-sectional view of the field-effect transistor according to the sixth embodiment.

Since a field-effect transistor according to a sixth embodiment of the present invention has many points in common with the first embodiment, differences from the first embodiment will be mainly described. FIG. 10 is a cross-sectional view of the field-effect transistor according to the sixth embodiment of the present invention. An embedded layer 30M and an additional embedded layer 30N are formed of crystal defects. That is, the embedded layer 30M and the additional embedded layer 30N have higher crystal defect densities than in their vicinity.

Ion beams are impinged on the channel layer 14 across the protective film 24 and the electron supply layer 16, and the embedded layer 30M and the additional embedded layer 30N are formed at positions where ions are stopped. Therefore, ion acceleration energy is adjusted so that the embedded layer 30M and the additional embedded layer 30N are formed in places deeper than the two-dimensional electron gas region where the two-dimensional electron gas is formed.

When Ar ions are impinged on the channel layer 14 to form the embedded layer 30M and the additional embedded layer 30N, it has been proven according to a simulation result that the ion acceleration energy is preferably on the order of several tens to several hundreds of keV. The ions to be impinged on the channel layer 14 are selected from among Ar, Kr, Fe, Br, Xe, Eu and B, for example.

It is possible to reduce the concentration of the two-dimensional electron gas by increasing the potential of the two-dimensional electron gas region through a pinning effect of the embedded layer 30M and the additional embedded layer 30N.

Seventh Embodiment

Figure 11:
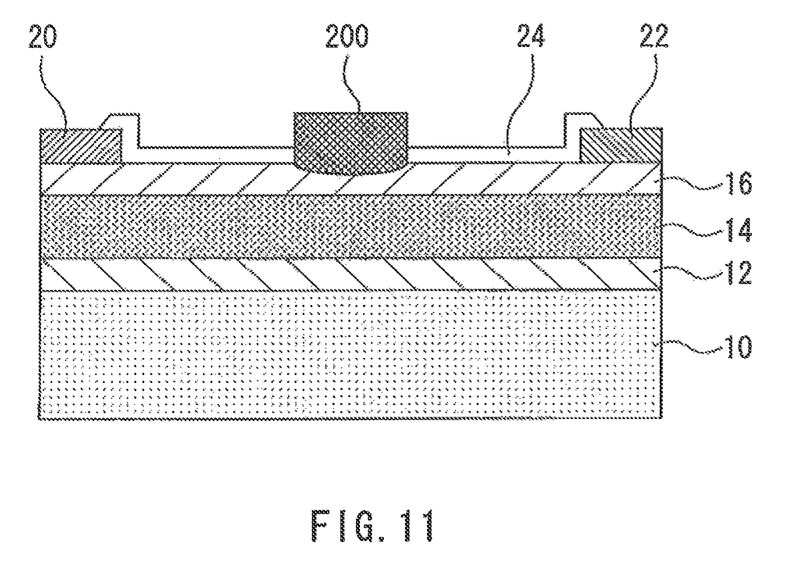
FIG. 11 is a cross-sectional view of the field-effect transistor according to the seventh embodiment.

Since a field-effect transistor according to a seventh embodiment of the present invention has many points in common with the first embodiment, differences from the first embodiment will be mainly described. FIG. 11 is a cross-sectional view of the field-effect transistor according to the seventh embodiment of the present invention. The undersurface of a gate electrode 200 is formed of a curved surface. No embedded layer or additional embedded layer is formed.

There is a problem that when a corner (end) of the gate electrode comes into contact with the electron supply layer 16, an electric field concentrates directly below this end. The field-effect transistor according to the seventh embodiment of the present invention adopts the gate electrode 200 whose undersurface is a curved surface, and can thereby prevent concentration of the electric field directly below the end of the gate electrode 200. The features of the field-effect transistors of the respective embodiments described so far may also be combined as appropriate.

According to the present invention, it is possible to prevent deterioration of electric characteristics while preventing an electric field from concentrating directly below the end of the gate electrode on the drain electrode side, producing crystal defects.

Obviously many modifications and variations of the present invention are possible in the light of the above teachings. It is therefore to be understood that within the scope of the appended claims the invention may be practiced otherwise than as specifically described.

What is claimed is:

1. A field-effect transistor comprising:
an electron supply layer;
a channel layer having an interface with the electron supply layer and a two-dimensional electron gas located proximate the interface with the electron supply layer;
a source electrode located on the electron supply layer;
a drain electrode located on the electron supply layer;
a gate electrode located on the electron supply layer between the source electrode and the drain electrode; and
an embedded layer embedded in the channel layer farther from the interface of the electron supply layer and the channel layer than a two-dimensional electron gas region in which the two-dimensional electron gas is located, directly opposite to an edge of the gate electrode, on a side of the gate electrode toward the drain electrode, and having a width in a range from 0.1 μm to 2 μm wherein
the embedded layer is AlGaN and increases potential of the two-dimensional electron gas region relative to the potential of the two-dimensional electron gas region of the field-effect transistor without the embedded layer,
in a plan view, the gate electrode and the embedded layer have respective sizes and linear shapes, and
the embedded layer extends along a longitudinal direction of the gate electrode.

2. The field-effect transistor according to claim 1, wherein the electron supply layer is AlGaN, and the channel layer is GaN.

3. The field-effect transistor according to claim 1, further comprising an additional embedded layer embedded in the channel layer farther from the interface of the electron supply layer and the channel layer than the two-dimensional electron gas region in which the two-dimensional electron gas is located, directly opposite to an edge of the gate electrode, on a side of the gate electrode toward the source electrode, wherein
the additional embedded layer has a size and a shape similar to the size and the shape of the embedded layer, and
the additional embedded layer that is AlGaN and increases the potential of the two-dimensional electron gas region relative to the potential of the two-dimensional electron gas region of the field-effect transistor with no additional embedded layer.

* * * * *